US007800175B2

(12) United States Patent
Ono et al.

(10) Patent No.: US 7,800,175 B2
(45) Date of Patent: Sep. 21, 2010

(54) VERTICAL POWER SEMICONDUCTOR DEVICE WITH HIGH BREAKDOWN VOLTAGE CORRESPONDING TO EDGE TERMINATION AND DEVICE REGIONS

(75) Inventors: Syotaro Ono, Kanagawa-ken (JP); Wataru Saito, Kanagawa-ken (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 175 days.

(21) Appl. No.: 12/243,280

(22) Filed: Oct. 1, 2008

(65) Prior Publication Data

US 2009/0090968 A1 Apr. 9, 2009

(30) Foreign Application Priority Data

Oct. 1, 2007 (JP) ............................. 2007-257684

(51) Int. Cl.
*H01L 29/78* (2006.01)

(52) U.S. Cl. ............................. 257/341; 257/E29.257; 257/329; 438/268

(58) Field of Classification Search ................. 257/341, 257/E29.257

See application file for complete search history.

(56) References Cited

U.S. PATENT DOCUMENTS

2007/0272977 A1 11/2007 Saito et al.
2007/0272979 A1 11/2007 Saito et al.
2008/0179671 A1 7/2008 Saito et al.

FOREIGN PATENT DOCUMENTS

JP 2000-183350 6/2000
JP 3392665 1/2003
JP 2006-73740 3/2006

*Primary Examiner*—Thanh V Pham
*Assistant Examiner*—Mark A Laurenzi, III
(74) *Attorney, Agent, or Firm*—Oblon, Spivak, McClelland, Maier & Neustadt, L.L.P.

(57) ABSTRACT

A semiconductor apparatus includes: a semiconductor layer of a first conductivity type; a first main electrode provided on a frontside of the semiconductor layer; a second main electrode provided on a backside of the semiconductor layer, the backside being opposite to the frontside; a plurality of semiconductor regions of a second conductivity type provided in a surface portion of the semiconductor layer in a edge termination region outside a device region in which a main current path is formed in a vertical direction between the first main electrode and the second main electrode; and a plurality of buried semiconductor regions of the second conductivity type provided in the semiconductor layer in the edge termination region, spaced from the semiconductor regions, and spaced from each other. The buried semiconductor regions provided substantially at the same depth from the frontside of the semiconductor layer are numbered as first, second, . . . , n-th, sequentially from the one nearer to the device region, the n-th buried semiconductor regions provided at different depths from the frontside of the semiconductor layer are displaced toward the device region relative to the corresponding n-th semiconductor region, and the buried semiconductor region located deeper from the frontside of the semiconductor layer is displaced more greatly toward the device region.

20 Claims, 5 Drawing Sheets

VERTICAL POWER SEMICONDUCTOR DEVICE WITH HIGH BREAKDOWN VOLTAGE CORRESPONDING TO EDGE TERMINATION AND DEVICE REGIONS

CROSS-REFERENCE TO RELATED APPLICATIONS

This application is based upon and claims the benefit of priority from the prior Japanese Patent Application No. 2007-257684, filed on Oct. 1, 2007; the entire contents of which are incorporated herein by reference.

BACKGROUND OF THE INVENTION

1. Field of the Invention

This invention relates to a semiconductor apparatus.

2. Background Art

In a vertical semiconductor apparatuses for power electronics applications, a main current path is formed in the vertical direction between a first main electrode and a second main electrode provided respectively on the frontside and backside of a semiconductor layer. Such semiconductor apparatuses have fast switching characteristics and a reverse blocking voltage (breakdown voltage) of several ten to several hundred volts, and are widely used for electric power conversion and control in home electric apparatuses, communication apparatuses, and car-mounted motors. To achieve downsizing, high efficiency, and low power consumption in these fields, the on-state resistance needs to be reduced. That is, vertical power semiconductor apparatuses are strongly required to have low on-resistance while retaining high breakdown voltage.

The on-resistance of a vertical semiconductor apparatus greatly depends on the electric resistance of its drift layer. The impurity concentration that determines the electric resistance of the drift layer cannot exceed a maximum limit, which depends on the breakdown voltage of the pn junction formed between the base region and the drift layer. Thus, there is a tradeoff between the device breakdown voltage and the on-resistance. Improving this tradeoff is important for low power consumption devices. This tradeoff has a limit determined by the device material.

The so-called superjunction structure is known as a structure to solve this problem. In the superjunction structure, a periodic array structure of p-type semiconductor pillar layers and n-type semiconductor pillar layers is provided in the drift layer (e.g., JP-A-2000-183350 (Kokai) and JP-A-2006-073740 (Kokai)).

In vertical power semiconductor apparatuses, high breakdown voltage is required not only in the device region where the main current path is formed during the on-time, but also in the edge termination region outside the device region.

SUMMARY OF THE INVENTION

According to an aspect of the invention, there is provided a semiconductor apparatus including: a semiconductor layer of a first conductivity type; a first main electrode provided on a frontside of the semiconductor layer; a second main electrode provided on a backside of the semiconductor layer, the backside being opposite to the frontside; a plurality of semiconductor regions of a second conductivity type provided in a surface portion of the semiconductor layer in a edge termination region outside a device region in which a main current path is formed in a vertical direction between the first main electrode and the second main electrode; and a plurality of buried semiconductor regions of the second conductivity type provided in the semiconductor layer in the edge termination region, spaced from the semiconductor regions, and spaced from each other, the buried semiconductor regions provided substantially at the same depth from the frontside of the semiconductor layer being numbered as first, second, . . . , n-th, sequentially from the one nearer to the device region, the n-th buried semiconductor regions provided at different depths from the frontside of the semiconductor layer being displaced toward the device region relative to the corresponding n-th semiconductor region, and the buried semiconductor region located deeper from the frontside of the semiconductor layer being displaced more greatly toward the device region.

DETAILED DESCRIPTION OF THE INVENTION

An embodiment of the invention will now be described with reference to the drawings. The following embodiment is described assuming that the first conductivity type and the second conductivity type are n-type and p-type, respectively.

Figure 1:
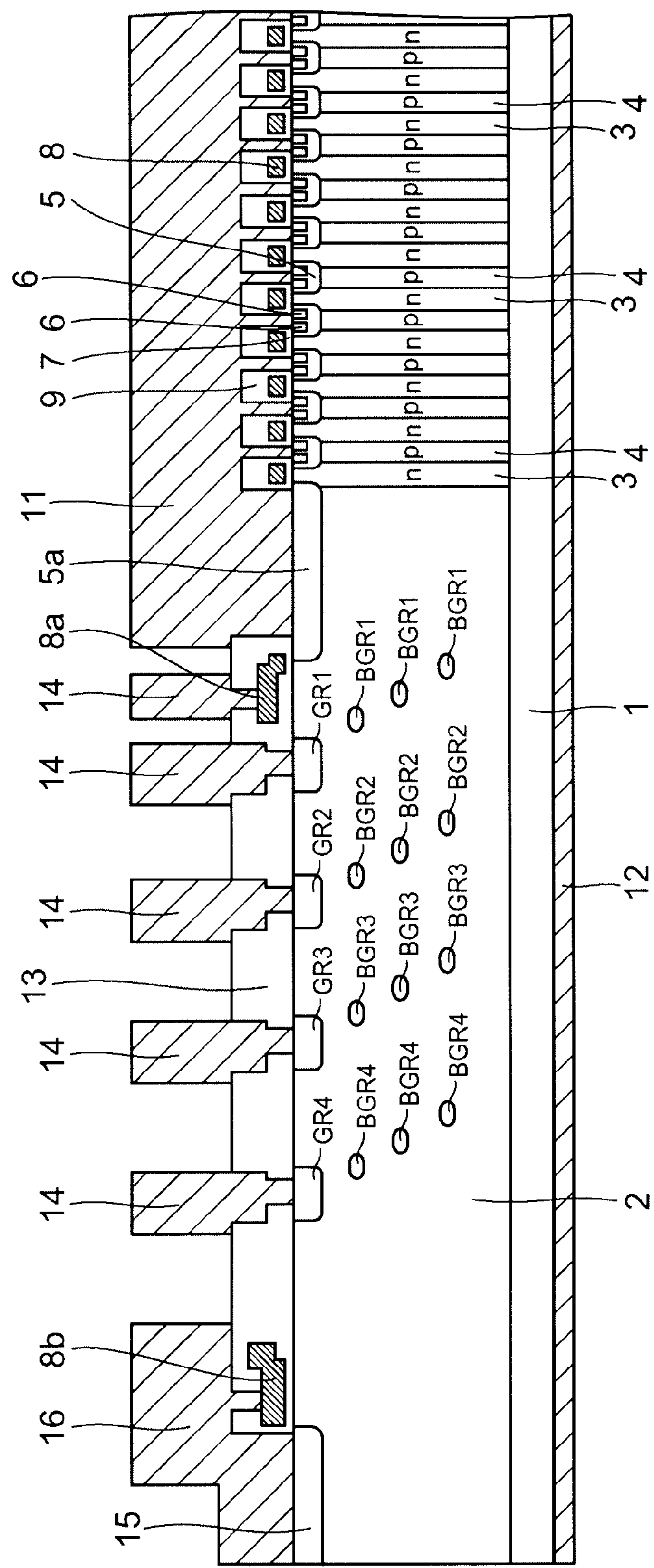
FIG. 1 is a schematic cross-sectional view of the main part of a semiconductor apparatus according to the embodiment of the invention.

FIG. 1 is a schematic cross-sectional view of the main part of a semiconductor apparatus according to the embodiment of the invention.

Figure 2:
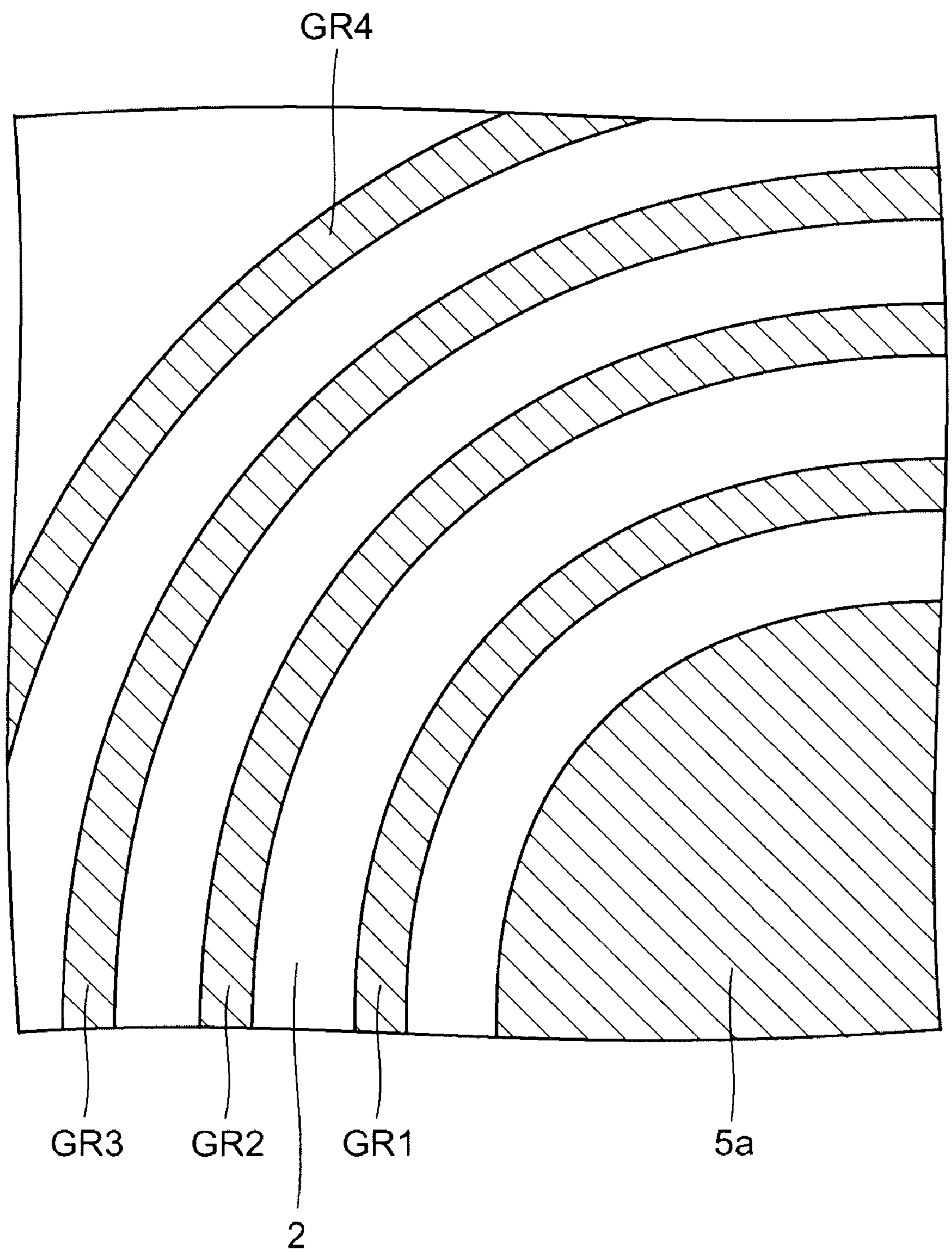
FIG. 2 is a schematic plan view showing the planar layout of an outermost base region and semiconductor regions GR1-GR4 in this semiconductor apparatus.

FIG. 2 is a schematic plan view showing the planar layout of an outermost base region **5*a* and semiconductor regions GR1-GR4** in this semiconductor apparatus.

This embodiment is described with a vertical MOSFET (metal-oxide-semiconductor field effect transistor) taken as an example. This MOSFET includes a semiconductor structure made of a semiconductor material such as silicon. In this MOSFET, during the gate-on time, a main current path is formed in the vertical direction between a source electrode 11 serving as a first main electrode provided on the frontside of the semiconductor structure and a drain electrode 12 serving as a second main electrode provided on the backside, which is the opposite side to the surface on which the source electrode 11 is provided.

An $n^+$-type drain layer (or $n^+$-type substrate) 1 is provided as the bottom layer of the semiconductor structure. A device region is defined as a region where, during the on-time, the main current flows in the vertical direction between the source electrode 11 and the drain electrode 12. On the major surface of the drain layer 1 in the device region, n-type pillar layers 3 serving as first semiconductor pillar layers and p-type pillar layers 4 serving as second semiconductor pillar layers are provided.

Figure 5A:
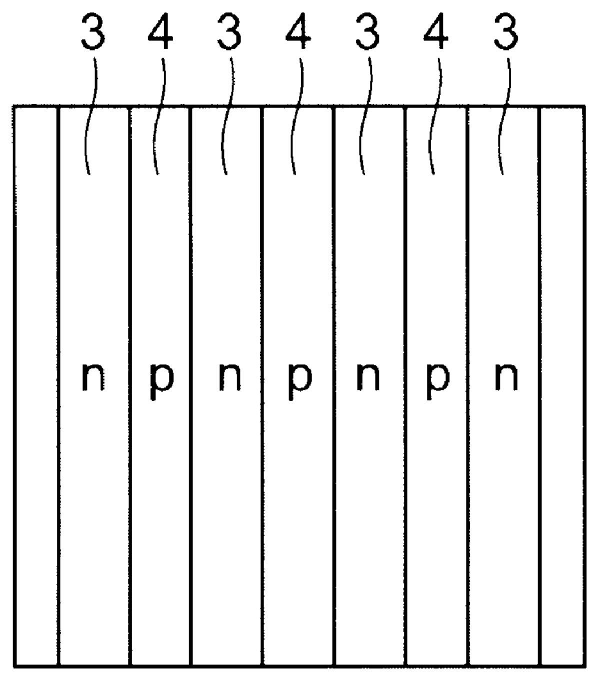
FIGS. 5A and 5B are schematic views showing one example of the planar pattern of the n-type pillar layers and the p-type pillar layers shown in FIG. 1.
Figure 5B:
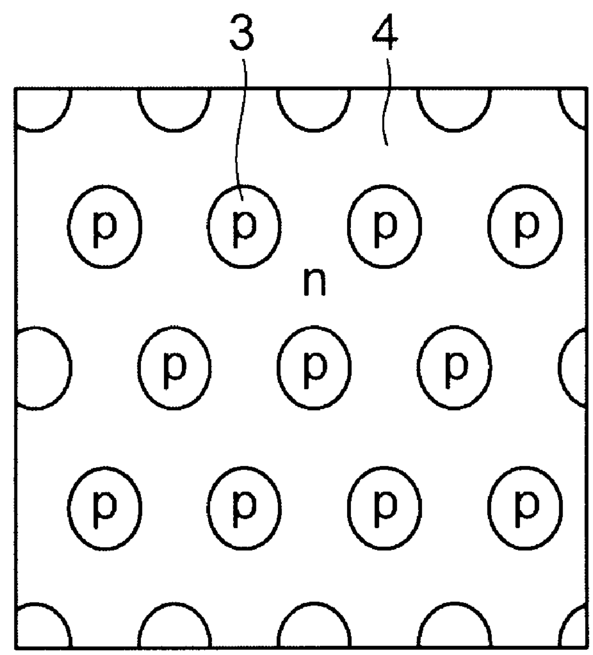

The n-type pillar layers 3 and the p-type pillar layers 4 are periodically arrayed, alternately adjacent to (in pn junction with) each other in the horizontal direction generally perpendicular to the above-mentioned vertical direction (in the direction generally parallel to the major surface of the drain layer 1), constituting the so-called "superjunction structure". The planar pattern of the n-type pillar layers 3 and the p-type pillar layers 4 can be a striped configuration as shown in FIG. 5A, or a lattice or staggered configuration as shown in FIG. 5B.

A p-type base region 5 is provided on the p-type pillar layer 4. An $n^+$-type source region 6 is selectively provided in the surface of the base region 5.

On the surface of the portion extending from the n-type pillar layer 3 through the base region 5 to the source region 6, a control electrode (gate electrode) 8 is provided via a gate insulating film (e.g., silicon oxide film) 7.

The source electrode 11 is in contact with part of the surface of the source region 6 and the base region 5. In the surface of the base region 5 being in contact with the source electrode 11, a $p^+$-type contact region (not shown) having a higher impurity concentration than the other portion of the base region 5 is formed. The source electrode 11 is electrically connected to the source region 6, and the base region 5 is fixed to the source potential through the contact region. The control electrode 8 is insulated from the source electrode 11 by an interlayer insulating film 9. The drain electrode 12 is provided in contact with the backside of the drain layer 1.

When a prescribed gate voltage is applied to the control electrode 8 during the on-time, an inversion layer (channel) is formed in a portion of the base region 5 opposed to the control electrode 8 and allows a main current to flow in the vertical direction between the source electrode 11 and the drain electrode 12 through the source region 6, the channel, the n-type pillar layer 3, and the drain layer 1.

The semiconductor apparatus according to this embodiment includes a periodic array structure of n-type pillar layers 3 and p-type pillar layers 4, known as the "superjunction structure", in the portion corresponding to the drift layer where a current flows during the on-time. During the off-time, under a high voltage applied to the drain electrode 12, a depletion layer extends from the pn junction interface between the base region 5 and the n-type pillar layer 3. In the superjunction structure, a depletion layer extends also from the pn junction interface between the p-type pillar layer 4 and the n-type pillar layer 3. Hence, electric field concentration on only the pn junction interface between the base region 5 and the n-type pillar layer 3 is alleviated, and the breakdown voltage is held by the entire drift layer. Thus, a high breakdown voltage can be obtained even if the n-type pillar layer 3 has a relatively high impurity concentration. On the other hand, during the on-time, the current flows through the n-type pillar layers 3 having a high impurity concentration. Hence, the on-resistance can be reduced to approximately ⅕ as compared with devices having a comparable breakdown voltage without the superjunction structure.

On the major surface of the drain layer 1 in an edge termination region, which is located outside the device region including the superjunction structure, an $n^-$-type high-resistance semiconductor layer 2 having a lower impurity concentration than the n-type pillar layer 3 is provided.

The edge termination region includes no MOS structure. Hence, during the on-time, no channel is formed, and the main current in the vertical direction does not flow. In the surface portion of the high-resistance semiconductor layer 2 located at the boundary between the device region and the edge termination region, a p-type outermost base region 5_a_ is formed in the same process as the base region 5 where an inversion layer (channel) is formed during the on-time. However, no source region 6 is provided in the surface of the outermost base region 5_a_, and no control electrode 8 is provided thereon. Hence, no inversion layer (channel) is formed in the outermost base region 5_a_. As a result, a current path in the vertical direction is not formed in the outermost base region 5_a_ even when an on-voltage is applied to the control electrode 8.

In the surface portion of the high-resistance semiconductor layer 2 outside the outermost base region 5_a_, a plurality of p-type semiconductor regions GR1-GR4 are formed. Here, the planar shape of the semiconductor regions GR1-GR4 is illustratively a ring shape. The outermost base region 5_a_ and the semiconductor regions GR1-GR4 are spaced from each other and, for example, concentrically surround the device region as shown in the plan view of the main part in FIG. 2.

On the surface of the high-resistance semiconductor layer 2 in the edge termination region, a field insulating film (e.g., silicon oxide film) 13 is provided. A field plate electrode 14 is provided on the field insulating film 13 and is in contact with the surface of the semiconductor regions GR1-GR4 through vias formed in the field insulating film 13. The field plate electrode 14 is floating in potential. Alternatively, the field plate electrode 14 can be connected to the source electrode 11 or the control electrode 8. The field plate electrode 14 which is closest to the device region is in contact with the electrode 8_a_ which is formed at the same time with the control electrode 8 in the device region and is provided in the field insulating film 13. The electrode 8_a_ is in a floating state.

Furthermore, a plurality of p-type buried semiconductor regions BGR1-BGR4 are provided in the high-resistance semiconductor layer 2. Here, the planar shape of the buried semiconductor regions BGR1-BGR4 is illustratively a ring shape. The buried semiconductor regions BGR1-BGR4 are located below the semiconductor regions GR1-GR4 formed in the surface portion, spaced from the semiconductor regions GR1-GR4, and also spaced from each other. The buried semiconductor regions BGR1-BGR4 are formed, for example, concentrically with respect to the semiconductor regions GR1-GR4 and surround the device region. The buried semiconductor regions BGR1-BGR4 are floating in potential.

The impurity concentration in the buried semiconductor regions BGR1-BGR4 is controlled so that they are completely depleted if the depletion layer extending from the outermost base region 5_a_ side reaches them under a high voltage applied between the drain electrode 12 and the source electrode 11. Alternatively, the buried semiconductor regions BGR1-BGR4 can be depleted only in part if the above depletion layer reaches them.

In the example shown in FIG. 1, four semiconductor regions GR1-GR4 are illustratively formed in the surface portion of the high-resistance semiconductor layer 2. However, the number of semiconductor regions is not limited thereto. Furthermore, four buried semiconductor regions BGR1-BGR4 are illustratively provided at each depth (substantially at the same depth from the frontside of the high-resistance semiconductor layer 2). However, the number of buried semiconductor regions BGR1-BGR4 located at each depth is not limited to four. Moreover, in the example of FIG. 1, the buried semiconductor regions BGR1-BGR4 are provided in three different levels of depth. However, the number of levels of depth is not also limited thereto.

Here, the buried semiconductor regions BGR1-BGR4 provided in the high-resistance semiconductor layer 2 substantially at the same depth from the frontside thereof are numbered as first, second, . . . , n-th, sequentially from the one nearer to the device region. The n-th buried semiconductor regions BGR(n) provided at different depths (here, n ranges from 1 to 4 in the example shown in FIG. 1) are displaced toward the device region relative to the n-th semiconductor region GR(n) (n ranges from 1 to 4 in the example shown in FIG. 1), and the buried semiconductor region located deeper from the frontside of the high-resistance semiconductor layer 2 is displaced more greatly toward the device region.

That is, in the example shown in FIG. 1, the semiconductor region GR1 is the first semiconductor region as counted sequentially from the one nearer to the device region. Following thereto, the semiconductor regions GR2, GR3, and GR4 are the second, third, and fourth semiconductor region, respectively.

Of the four buried semiconductor regions BGR1-BGR4 provided at the shallowest position from the frontside of the high-resistance semiconductor layer 2, the buried semiconductor region BGR1 is the first as counted sequentially from the one nearer to the device region. Following thereto, the buried semiconductor regions BGR2, BGR3, and BGR4 are the second, third, and fourth, respectively. Furthermore, the first buried semiconductor region BGR1 is displaced toward the device region relative to the corresponding first semiconductor region GR1. Likewise, the second buried semiconductor region BGR2 is displaced toward the device region relative to the corresponding second semiconductor region GR2, the third buried semiconductor region BGR3 is displaced toward the device region relative to the corresponding third semiconductor region GR3, and the fourth buried semiconductor region BGR4 is displaced toward the device region relative to the corresponding fourth semiconductor region GR4.

Likewise, also with regard to the four buried semiconductor regions BGR1-BGR4 provided at the other depths, the first buried semiconductor region BGR1 is displaced toward the device region relative to the corresponding first semiconductor region GR1, the second buried semiconductor region BGR2 is displaced toward the device region relative to the corresponding second semiconductor region GR2, the third buried semiconductor region BGR3 is displaced toward the device region relative to the corresponding third semiconductor region GR3, and the fourth buried semiconductor region BGR4 is displaced toward the device region relative to the corresponding fourth semiconductor region GR4.

Furthermore, with regard to the three buried semiconductor regions BGR1 located at the same first position with different depths, the one located deeper from the frontside of the high-resistance semiconductor layer 2 is displaced more greatly toward the device region. Likewise, also with regard to the three buried semiconductor regions BGR2 located at the same second position with different depths, the one located deeper from the frontside of the high-resistance semiconductor layer 2 is displaced more greatly toward the device region. Also with regard to the three buried semiconductor regions BGR3 located at the same third position with different depths, the one located deeper from the frontside of the high-resistance semiconductor layer 2 is displaced more greatly toward the device region. Also with regard to the three buried semiconductor regions BGR4 located at the same fourth position with different depths, the one located deeper from the frontside of the high-resistance semiconductor layer 2 is displaced more greatly toward the device region.

An n-type field stop layer 15 is formed in the surface of the outermost edge of the edge termination region, and an equipotential ring (metal) 16 is formed on the surface thereof. The equipotential ring 16 is in contact with the electrode **8*b* which is formed at the same time with the control electrode 8 in the device region and is provided in the field insulating film 13. The electrode 8*b* is in a floating state. If the depletion layer reaches the surface or side face (dicing line) of the chip edge termination region, it may cause a leakage current. However, extension of the depletion layer at the edge termination region can be prevented by providing the above-mentioned field stop layer 15 and the equipotential ring 16** at the chip edge termination region.

Because the $n^-$-type high-resistance semiconductor layer 2 having a lower impurity concentration than the n-type pillar layer 3 is provided in the edge termination region, the depletion layer easily extends in the edge termination region, achieving a higher breakdown voltage in the edge termination region than in the device region. The semiconductor regions GR1-GR4 formed in the surface portion of the high-resistance semiconductor layer 2 are floating in potential. If a high voltage is applied between the drain electrode 12 and the source electrode 11 and the depletion layer extending from the outermost base region **5*a* side reaches the first semiconductor region GR1, then this semiconductor region GR1 is fixed to an arbitrary potential between the source and the drain. Because the $n^-$-type high-resistance semiconductor layer 2 has a potential connected to the drain, a potential difference occurs between the semiconductor region GR1 and the $n^-$-type high-resistance semiconductor layer 2, and the depletion layer extends further to the outside. If this depletion layer reaches the second semiconductor region GR2, this semiconductor region GR2 is also fixed to an arbitrary potential, and the depletion layer extends further to the outside. Likewise, if the depletion layer reaches the third semiconductor region GR3, this semiconductor region GR3 is also fixed to an arbitrary potential, and the depletion layer extends further to the outside. Furthermore, if the depletion layer reaches the fourth semiconductor region GR4, this semiconductor region GR4 is also fixed to an arbitrary potential, and the depletion layer extends further to the outside. That is, before the critical electric field is exceeded by the electric field at the corner outside the outermost base region 5*a*, which is susceptible to electric field concentration, the depletion layer successively extends to the outer semiconductor regions GR1-GR4**, which jointly share the electric field peak to prevent local electric field concentration in the edge termination region.

To alleviate electric field concentration on the corner of the outermost base region **5*a*, the depletion layer needs to be extended to the outside of the edge termination region in conformity with the curvature of the corner. The semiconductor regions GR1-GR4 formed in the surface portion extends the depletion layer primarily in the horizontal direction. Hence, in order to extend the depletion layer in conformity with the curvature of the corner of the outermost base region 5*a* by using only the semiconductor regions GR1-GR4** formed in the surface portion, a horizontally long termination length is required.

Because the main current path is not formed in the edge termination region, the edge termination region does not contribute to the reduction of on-resistance. Hence, the horizontally long design of the edge termination region increases the wasteful chip area that does not contribute to the reduction of on-resistance, and decreases the number of chips per wafer, leading to increased cost per chip.

Thus, in this embodiment, in addition to the semiconductor regions GR1-GR4 provided in the surface portion, a plurality of buried semiconductor regions BGR1-BGR4 are provided in the high-resistance semiconductor layer 2. As described above, in the n-th set of the semiconductor region GR(n) and the buried semiconductor regions BGR(n) as counted from the one nearer to the device region, the position of the region located deeper from the surface portion is gradually shifted toward the device region.

The semiconductor regions GR1-GR4 and the buried semiconductor regions BGR1-BGR4 are floating in potential. If a high voltage is applied between the drain electrode 12 and the source electrode 11 and the depletion layer extending from the outermost base region 5*a* side reaches the first set of the semiconductor region GR1 and the buried semiconductor regions BGR1, then they are fixed to an arbitrary potential between the source and the drain, and the depletion layer extends further to the outside. Here, because the first set of the semiconductor region GR1 and the buried semiconductor regions BGR1 has a shifted configuration as described above, the depletion layer can be extended from the corner of the outermost base region 5*a* in the horizontal direction, the vertical direction, and an oblique direction therebetween in conformity with the curvature thereof.

If the depletion layer extending from the first set of the semiconductor region GR1 and the buried semiconductor regions BGR1 reaches the second set of the semiconductor region GR2 and the buried semiconductor regions BGR2, they are partly or completely depleted, the potential thereof is fixed, and the depletion layer extends further to the outside. Here, because the second set of the semiconductor region GR2 and the buried semiconductor regions BGR2 also has a shifted configuration as described above, the depletion layer can be extended in the horizontal, vertical, and oblique direction in conformity with the curvature of the corner of the outermost base region 5*a*.

Likewise, because the third set of the semiconductor region GR3 and the buried semiconductor regions BGR3, and the fourth set of the semiconductor region GR4 and the buried semiconductor regions BGR4 also have a shifted configuration as described above, the depletion layer can be extended from the corner of the outermost base region 5*a* to the edge termination region in conformity with the curvature thereof.

That is, according to this embodiment, the depletion layer can be rapidly extended not only in the horizontal direction, but also in an oblique direction or the vertical direction in conformity with the curvature of the corner of the outermost base region 5*a*. Thus, the depletion layer can be extended in conformity with the curvature of the corner of the outermost base region 5*a* even with a short termination length, and local electric field concentration in the edge termination region can be alleviated to achieve a high breakdown voltage in the edge termination region. Furthermore, the length of the edge termination region that does not contribute to the reduction of on-resistance can be shortened to achieve cost reduction.

Furthermore, in the structure according to this embodiment, the edge termination region can be depleted also in the depth direction and oblique direction under a relatively low drain-source voltage. Thus, it is possible to increase not only the static breakdown voltage, but also the breakdown voltage for the drift layer containing residual carriers (dynamic breakdown voltage) in the edge termination region.

The edge termination region is required to have the characteristics of exhibiting higher static breakdown voltage and dynamic breakdown voltage than the device region. This embodiment can provide a semiconductor apparatus satisfying such characteristics and having high reliability.

In view of the current product design, the inventors have found that the design under the following condition is preferable to efficiently extending the depletion layer to the edge termination region with a desired curvature while shortening the termination length.

Let GR(n) denote the n-th semiconductor region, GR(n+1) the (n+1)-th semiconductor region, $W_{GR}$ the distance between the semiconductor region GR(n) and the semiconductor region GR(n+1) (the pitch between the semiconductor regions), BGR(n) the n-th buried semiconductor region, BGR (n+1) the (n+1)-th buried semiconductor region, and $W_{BGR}$ the distance between the buried semiconductor region BGR (n) and the buried semiconductor region BGR(n+1) located substantially at the same depth from the frontside of the high-resistance semiconductor layer 2 (the pitch between the buried semiconductor regions located at the same depth). Then, it is preferable that the design satisfy:

$$W_{GR}=A\times(n-1)+B>W_{BGR}$$

Optimal values for the parameters A and B in this relation are selected as described below to achieve high breakdown voltage.

Figure 4:
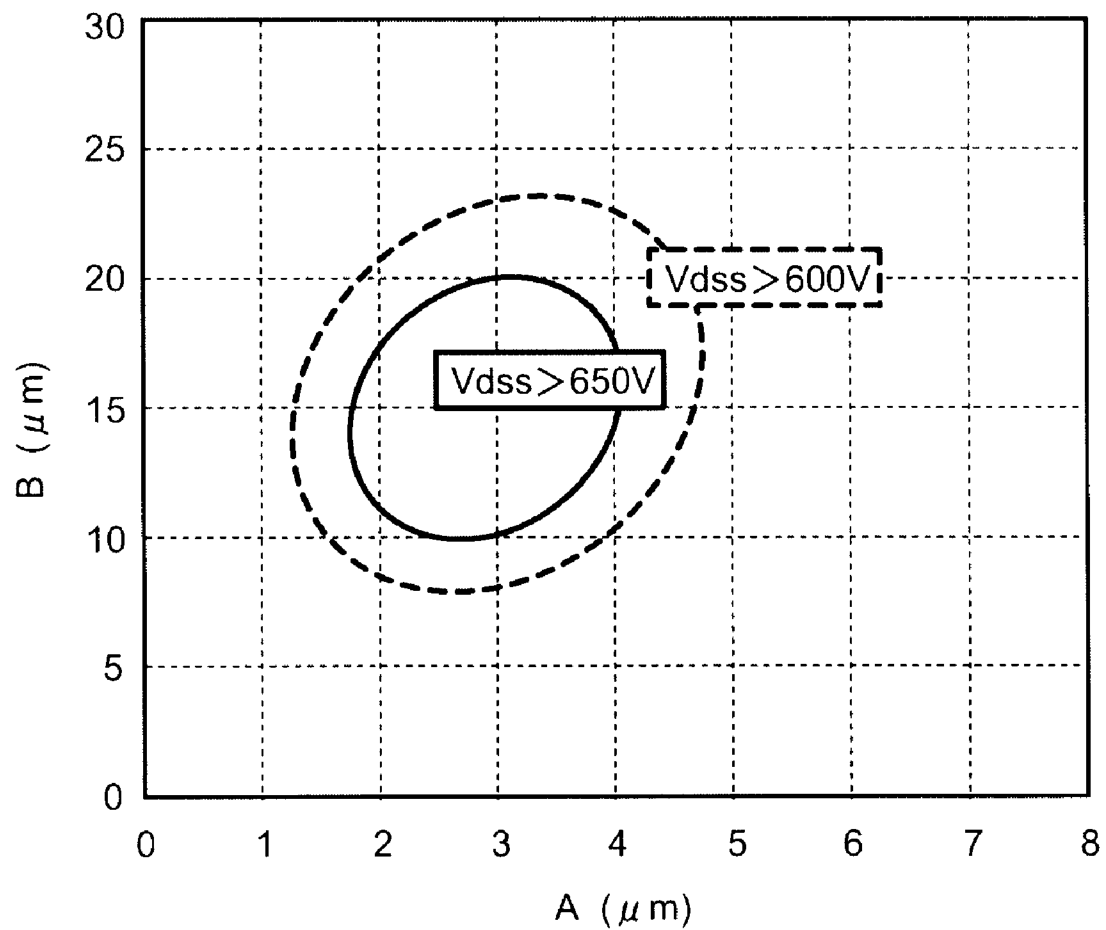
FIG. 4 is a schematic view showing a preferable set range for achieving high breakdown voltage in the semiconductor apparatus according to the embodiment of the invention, the range of A and B defining the pitch $W_{GR}$ between the semiconductor regions GR(n) and GR(n+1)

FIG. 4 shows the result of calculating the breakdown voltage Vdss in the case where the high-resistance semiconductor layer 2 has a thickness of 48 μm, the amount of offset (amount of protrusion) of the buried semiconductor regions BGR(n) relative to the corresponding n-th semiconductor region GR(n) are fixed, and the above parameters A and B are varied. To extend the depletion layer more easily in the depth direction, calculation is made for $W_{BGR}$ being 2 μm shorter than $W_{GR}$.

According to the calculation result, a breakdown voltage Vdss exceeding 600 V is obtained if A and B are set in the range enclosed by the dashed line in FIG. 4, and a breakdown voltage Vdss exceeding 650 V is obtained if A and B are set in the range enclosed by the solid line in FIG. 4. Hence, to achieve a higher breakdown voltage Vdss, the above parameters A and B are preferably set so as to satisfy 2 μm<A<4 μm and 10 μm<B<20 μm The embodiment of the invention has been described with reference to examples. However, the invention is not limited thereto, but can be variously modified within the spirit of the invention.

The above embodiment has been described assuming that the first conductivity type and the second conductivity type are n-type and p-type, respectively. However, the invention is practicable also in the case where the first conductivity type and the second conductivity type are p-type and n-type, respectively.

Figure 3:
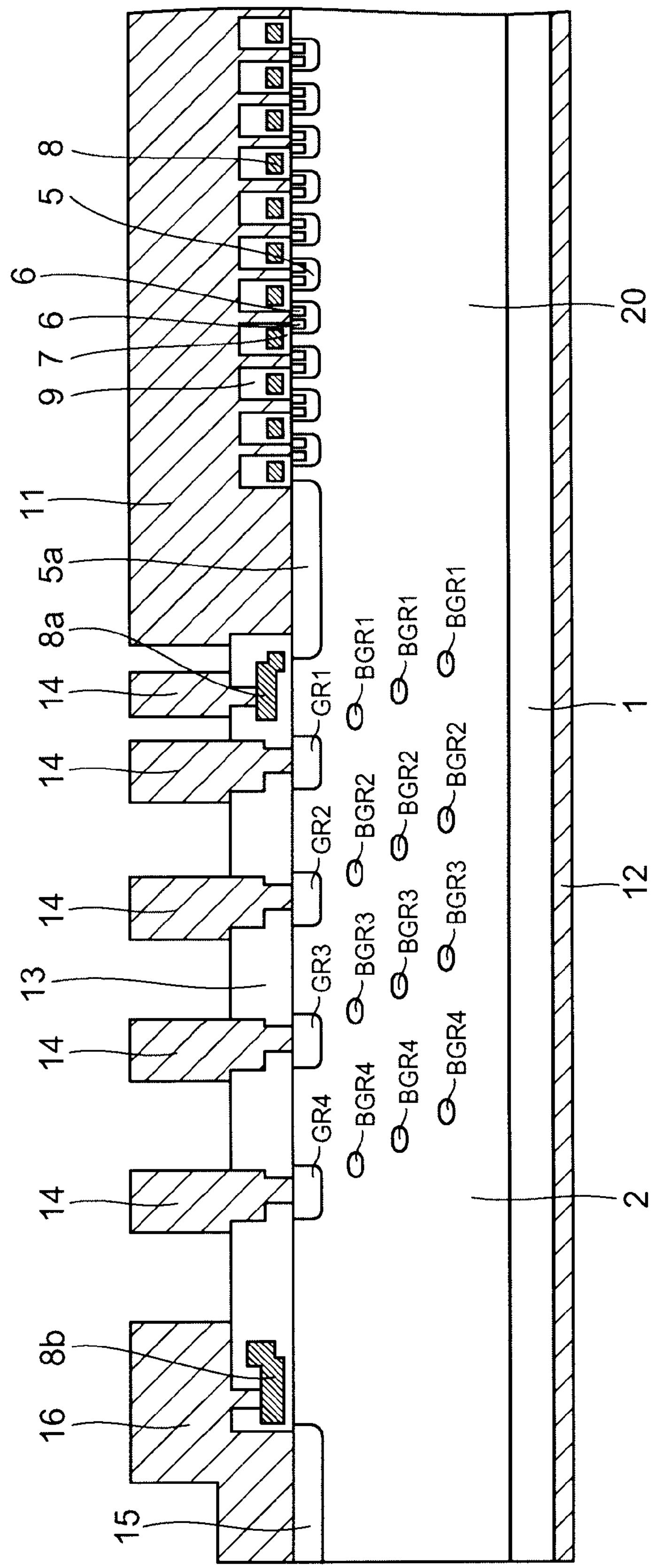
FIG. 3 is a schematic cross-sectional view of the main part of a semiconductor apparatus according to another embodiment of the invention.

The above embodiment has been described with reference to a planar gate structure. However, a trench gate structure can also be used. Furthermore, besides the MOSFET, the invention is also applicable to such devices as IGBT (insulated gate bipolar transistor). Moreover, as shown in FIG. 3, the invention is also applicable to a semiconductor apparatus in which the device region has no superjunction structure, but includes an n-type semiconductor layer 20.

Furthermore, the semiconductor is not limited to silicon, but silicon carbide (SiC), gallium nitride (GaN), and diamond can also be used.

The invention claimed is:

1. A semiconductor apparatus comprising:

a semiconductor layer of a first conductivity type;

a first main electrode provided on a frontside of the semiconductor layer;

a second main electrode provided on a backside of the semiconductor layer, the backside being opposite to the frontside;

a plurality of semiconductor regions of a second conductivity type provided in a surface portion of the semiconductor layer in a edge termination region outside a device region in which a main current path is formed in a vertical direction between the first main electrode and the second main electrode; and a plurality of buried semiconductor regions of the second conductivity type provided in the semiconductor layer in the edge termination region, spaced from the semiconductor regions, and spaced from each other, the buried semiconductor regions provided substantially at the same depth from the frontside of the semiconductor layer being numbered as first, second, . . . , n-th, sequentially from the one nearer to the device region, the n-th buried semiconductor regions provided at different depths from the frontside of the semiconductor layer being displaced toward the device region relative to the corresponding n-th semiconductor region, and the buried semiconductor region located deeper from the frontside of the semiconductor layer being displaced more greatly toward the device region.

2. The semiconductor apparatus according to claim 1, wherein the buried semiconductor regions are floating in potential.

3. The semiconductor apparatus according to claim 1, wherein the buried semiconductor regions surround the device region in a ring shape.

4. The semiconductor apparatus according to claim 1, wherein the semiconductor regions and the buried semiconductor regions surround the device region in a concentric ring shape.

5. The semiconductor apparatus according to claim 1, wherein the buried semiconductor regions are completely depleted under a high voltage applied between the first main electrode and the second main electrode.

6. The semiconductor apparatus according to claim 1, wherein the device region includes a MOS structure having:

a base region of the second conductivity type provided in a surface portion of the device region and electrically connected to the first main electrode;

a source region of the first conductivity type selectively provided in a surface of the base region and electrically connected to the first main electrode; and a control electrode provided on the surface of the base region between the source region and the semiconductor layer via an insulating film.

7. The semiconductor apparatus according to claim 6, further comprising:

an outermost base region of the second conductivity type provided in the surface portion of the semiconductor layer at a boundary between the device region and the edge termination region, wherein channel is not formed and a current path in the vertical direction is not formed in the outermost base region when an on-voltage is applied to the control electrode.

8. The semiconductor apparatus according to claim 1, wherein the semiconductor regions surround the device region in a ring shape.

9. The semiconductor apparatus according to claim 7, wherein the semiconductor regions and the outermost base region surround the device region in a concentric ring shape.

10. The semiconductor apparatus according to claim 1, wherein the semiconductor regions are floating in potential.

11. The semiconductor apparatus according to claim 1, further comprising:

a field plate electrode provided on a surface of the edge termination region and being in contact with the semiconductor regions.

12. The semiconductor apparatus according to claim 11, wherein the field plate electrode is floating in potential.

13. The semiconductor apparatus according to claim 11, wherein the field plate electrode is connected to the first main electrode.

14. The semiconductor apparatus according to claim 6, further comprising:

a field plate electrode provided on a surface of the edge termination region and being in contact with the semiconductor regions, wherein the field plate electrode is connected to the control electrode.

15. The semiconductor apparatus according to claim 1, further comprising:

a field stop layer of the first conductivity type provided in a surface of the outermost edge of the edge termination region.

16. The semiconductor apparatus according to claim 1, wherein $$W_{GR}=A\times(n-1)+B>W_{BGR} \text{ (where } 2\ \mu m<A<4\ \mu m \text{ and } 10\ \mu m<B<20\ \mu m)$$

where GR(n) and GR(n+1) are the n-th and (n+1)-th semiconductor region from the one nearer to the device region, respectively, $W_{GR}$ is the distance between the semiconductor region GR(n) and the semiconductor region GR(n+1), BGR (n) and BGR(n+1) are the n-th and (n+1)-th buried semiconductor region from the one nearer to the device region, and $W_{BGR}$ is the distance between the buried semiconductor region BGR(n) and the buried semiconductor region BGR(n+1) located substantially at the same depth from the frontside of the semiconductor layer.

17. The semiconductor apparatus according to claim 1, wherein the device region includes a periodic array structure of first semiconductor pillar layers of the first conductivity type and second semiconductor pillar layers of the second conductivity type which are arrayed alternately adjacent to each other in a horizontal direction generally perpendicular to the vertical direction.

18. The semiconductor apparatus according to claim 17, wherein the semiconductor layer in the edge termination region has a lower impurity concentration than the first semiconductor pillar layers in the device region.

19. The semiconductor apparatus according to claim 17, wherein the device region includes a MOS structure having:

a base region of the second conductivity type provided on the second semiconductor pillar layer and electrically connected to the first main electrode;

a source region of the first conductivity type selectively provided in a surface of the base region and electrically connected to the first main electrode; and a control electrode provided on the surface of the base region between the source region and the first semiconductor pillar layer via an insulating film.

20. The semiconductor apparatus according to claim 19, further comprising:

a field plate electrode provided on a surface of the edge termination region and being in contact with the semiconductor regions, wherein the field plate electrode is connected to the control electrode.

* * * * *